United States Patent [19]

Hideshima

[11] Patent Number: 5,202,578
[45] Date of Patent: Apr. 13, 1993

[54] MODULE-TYPE SEMICONDUCTOR DEVICE OF HIGH POWER CAPACITY

[75] Inventor: Makoto Hideshima, Tokyo, Japan

[73] Assignee: Kabushiki Kaisha Toshiba, Kawasaki, Japan

[21] Appl. No.: 760,281

[22] Filed: Sep. 16, 1991

Related U.S. Application Data

[63] Continuation of Ser. No. 579,661, Sep. 10, 1990, abandoned.

[30] Foreign Application Priority Data

Sep. 11, 1989 [JP] Japan .................................. 1-235240

[51] Int. Cl.⁵ ...................... H01L 23/28; H01L 23/02; H05K 7/11; H05K 7/00
[52] U.S. Cl. ..................................... 257/685; 257/678; 257/690; 257/691; 361/392; 361/393; 361/395
[58] Field of Search ....................... 357/68, 72, 75, 80, 357/38, 40, 41, 42, 43, 52, 59, 81; 361/392, 393, 395; 307/54, 270, 570, 572, 575

[56] References Cited

U.S. PATENT DOCUMENTS 4,905,069  2/1990  Shigekane ........................ 357/72
4,907,068  3/1990  Amann et al. .
4,970,576 11/1990  Neidig et al. .

FOREIGN PATENT DOCUMENTS 2718967 11/1978 Fed. Rep. of Germany .
0277546  8/1988 Fed. Rep. of Germany .
0292848 11/1988 Fed. Rep. of Germany .
2535898  5/1984 France .
0145256  6/1985 United Kingdom .

OTHER PUBLICATIONS

Conference Record of the 1989 IEEE Industry Applications Society Annual Meeting, Part II, pp. 1352–1355, San Diego, Calif., "300 Ampere, 1000 Volt Hermetic Darlington Transistor" by Merle Morozowich.

Primary Examiner—Andrew J. James
Assistant Examiner—Carl Whitehead, Jr.
Attorney, Agent, or Firm—Finnegan, Henderson, Farabow, Garrett & Dunner

[57] ABSTRACT

One of a pair of the module type semiconductor devices, signal input terminals are located on the other side of current output terminals with respect to current input terminals, and that, in the other of a pair of the module type semiconductor devices, signal input terminals are mounted on the other side of current input terminals with respect to current output terminals. Distance of connections between element in the case of bridge connections may be shortened to the minimum. Since the signal input terminals may be located outside the bus bars, openings need not be made in the bus bar. Space or the bus bar's surface area may be effectively used, with the result that a decrease in commutating inductance is achieved.

27 Claims, 6 Drawing Sheets

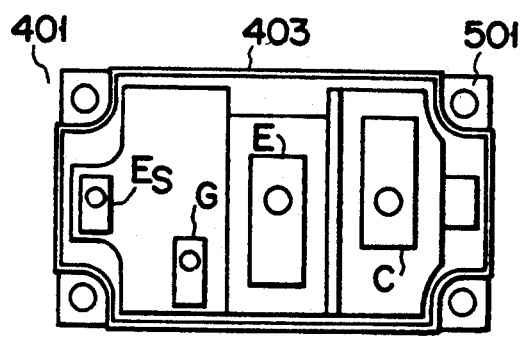
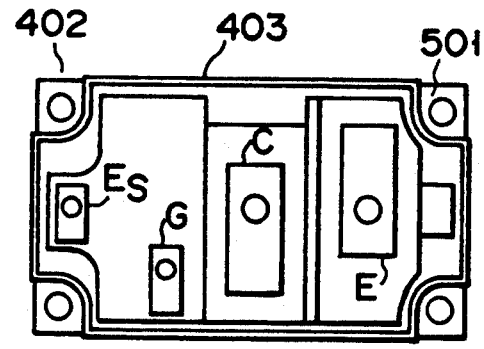
F I G. 4A    F I G. 4B
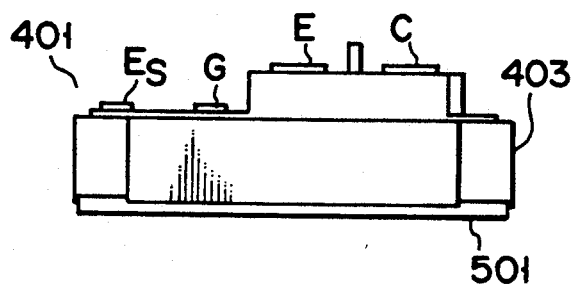
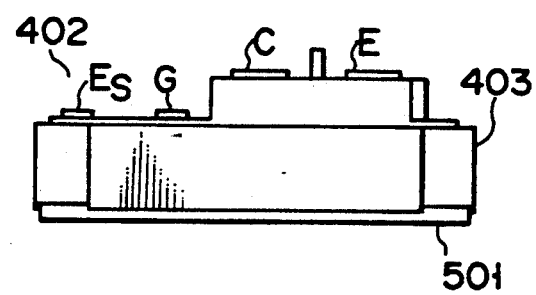
F I G. 4C    F I G. 4D
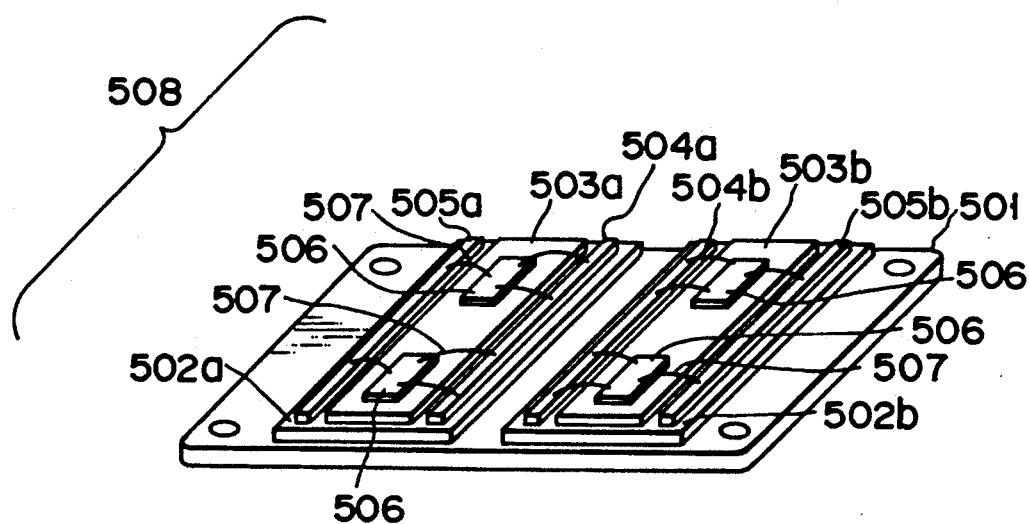
F I G. 5

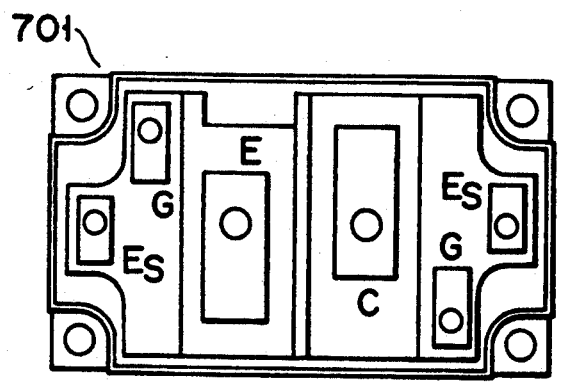
F I G. 7A
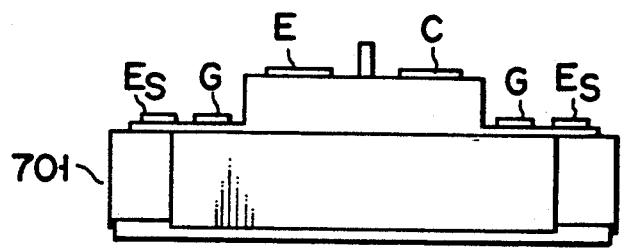
F I G. 7B
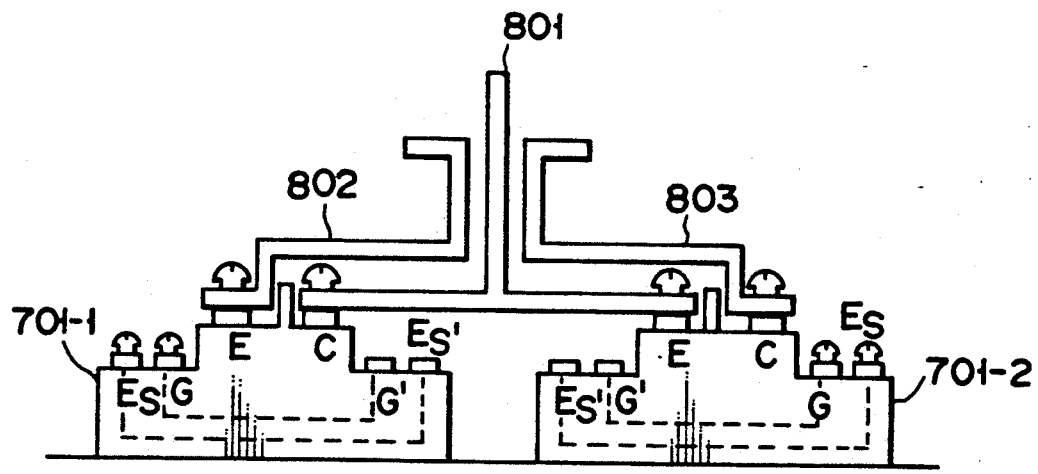
F I G. 8

MODULE-TYPE SEMICONDUCTOR DEVICE OF HIGH POWER CAPACITY

This is a continuation of application Ser. No. 07/579,661 filed Sep. 10, 1990 now abandoned Jan. 13, 1992, the contents of which are incorporated herein by reference.

BACKGROUND OF THE INVENTION

1. Field of the Invention

This invention relates to the arrangement of external terminals of a high power semiconductor device, such as an IGBT (insulated gate bipolar transistor) or a MOS FET, capable of high speed switching with high power and, more particularly, to the arrangement of module type semiconductor devices of high power capacity.

2. Description of the Related Art

IGBTs, representative of high speed and high power switching elements, have heretofore been made of module casings having a structure shown in FIGS. 1A and 1B. FIG. 1C shows an equivalent circuit of the IGBT.

In FIGS. 1A and 1B, a collector C and an emitter E the contacts to which serve as main current terminals, and a gate G and an emitter Es the contacts to which serve as input terminals for drive signals are used as corresponding, respectively, to a collector C and an emitter E the contacts to which serve as main current terminals in a bipolar transistor 101 shown in FIG. 1C, and a base B and an emitter Es the contacts to which serve as signal input terminals of same. Between the collector and the emitter is interposed a portion that functions similar to a diode, and hence a diode 102 is incorporated therebetween.

Within the module casing shown in FIGS. 1A and 1B are incorporated a plurality of, usually four, IGBT chips for being driven in parallel, thereby completing a high current semiconductor switching module.

The foregoing arrangement is disclosed in a publication entitled "1000 V 300 A Bipolar-Mode MOS FET (IGBT) Module", 1988 Proc. of ISPSD, pp 80-85, M. Hidesima, et al.

In some applications, a plurality of module type semiconductor devices of high power capacity of the arrangement shown in FIGS. 1A and 1B are connected in parallel to each other to obtain a circuit, such as an inverter, of further increased power capacity. In this case, it may be proposed to provide an ultra high power semiconductor device without connecting a plurality of modules but sealing several of modules in a single module casing. This, however, is not preferred on the following grounds.

First, the range of general applications of the module type semiconductor device becomes limited. Second, the number of parallel connections of IGBT chips within the module type semiconductor device become too excessive that the productivity of the device is decreased. Third, with an increase in a value of the current managed by a single module, wiring requirements within the device increase. Accordingly, use of module type semiconductor devices in parallel connections each having IGBT chips sealed within the casing in a convenient number of four is believed to be economical in high power capacity applications.

FIG. 2 is a circuit diagram showing the arrangement of a bridge-type chopper circuit using the module type semiconductor device of high capacity. Equivalent circuits Q1 to Q4 representing the IGBTs and each formed of a module type semiconductor device fabricated with a conventional module package shown in FIGS. 1A and 1B are connected two by two in parallel to obtain a high capacity. A half bridge structure showing the interconnection s of the equivalent circuits Q1 and Q2 in FIG. 2 is illustated in FIG. 3A. As shown, the module type semiconductor devices 301 and 302 are connected in parallel to form the equivalent circuit Q2, and the module type semiconductor devices 303 and 304 having equivalent properties as the devices 301 and 302 are connected in parallel to form the equivalent circuit Q1. A bus bar 305 connects main current terminals of the respective emitters of the module type semiconductor devices 301 and 302, and a bus bar 306 connects main current terminals of the respective collectors of the module type semiconductor devices 303 and 304. Further, a bus bar 307 makes interconnections between the collector main current terminals of the module type semiconductor devices 301 and 302, between the emitter main current terminals of the module type semiconductor devices 303 and 304, and between the module type semiconductor devices 301 and 302, and 303 and 304. The structure as viewed from an arrow 310 in FIG. 3A is shown in FIG. 3B.

As shown in FIGS. 3A and 3B, it is necessary to form openings 307a and 307b in the bus bar 307 at locations above signal input terminals Es and G of the module type semiconductor devices 303 and 304 to enable wiring connections to the signal terminals.

It has been found that, when the module type semiconductor devices fabricated with the module casing as shown in FIGS. 1A and 1B are subjected to bus bar wiring as shown in FIGS. 3A and 3B, a problem occurs that as the proposed current capacity of the module type semiconductor device increases and the proposed speed of switching operation increases, an inductance component of commutating circuits which increases surge voltage becomes substantial, requiring setting a large margin for the voltage withstandability of the circuit elements.

Moving to FIG. 2, the mechanism of commutating operation and the generation of surge voltage will be explained. The circuit shown is a so-called bridge circuit in which the IGBTs Q1 and Q2 are connected in series between a bus 202 and a bus 203 leading from a DC power supply 201, the IGBTs Q3 and Q4 are similarly connected in series therebetween, and an electric reactor 204 and a resistor 205 are connected between connecting points midway between the respective series connection lines.

Assume now that the IGBTs Q1 and Q4 are on and current is flowing through the circuit shown by arrows in solid lines. If the IGBT Q1 is turned off, a load current commutates through the circuit shown by an arrow in a dotted line. At this time, inductance L of the circuit and the rate of change of current di/dt generate a counter electromotive force of $-L(di/dt)$ as surge voltage, which is impressed across the IGBT Q1 which has been turned off.

The inductance L here is affected by an inductance component of the bus 202 between nodes a and b, an inductance component of the bus 203 between nodes h and i, inductance components of the wiring between nodes b and c and between d and e, and by inductance components of the wiring between nodes e and f and between g and h.

If, for example, the inductance L is 0.2 μH and an IGBT with a current of 400 A is turned off at time intervals of 0.3 μs, the following equation holds.

$$V = L(di/dt) = (0.2 \times 10\exp - 6)(400)/(0.3 \times 10\exp - 6) \simeq 270\ V \quad (1)$$

Equation (1) suggests the production of a surge voltage of approximately 270 V. To use an IGBT element at 500 V in the circuit arrangement shown in FIG. 2, it is necessary to use the voltage of the power supply at 230 V or below, so that use of IGBTs becomes limitative.

Where a module type semiconductor device of a package of the structure shown in FIGS. 1A and 1B is used, what has been done in an attempt to decrease inductance components as far as possible is to permit the collector C of the module forming Q1 and the emitter E of the module forming Q2 to be connected by a cupper plate and to punch out the cupper plate at portions of the terminals G and Es. This has resulted in lengthy wiring and limited surface area of the cupper plate and hence in an increase in commutating inductance. With increasing demand on still higher speed operation of module type semiconductor devices, a decrease in the commutating inductance has been sought.

SUMMARY OF THE INVENTION

According an object of the invention is to provide a module type semiconductor device having a shortened length of interconnection wiring, a large surface area of the wiring and a bridge connection structure capable of canceling magnetic flux to be generated by commutating current, with a view to minimizing commutating inductance.

According to a first embodiment of the invention, a pair of high power module type semiconductor devices are provided which comprise first and second casings of a substantially equivalent type; power semiconductor devices of substantially equivalent electrical properties sealed respectively within the first and second casings; and external terminals formed of current input terminals, current output terminals and signal input terminals of the power semiconductor devices, which are taken externally of the first and second casings from top thereof; the external terminals taken externally of the first casing having a terminal arrangement in which the signal input terminals are located on an opposite side of the current output terminal with respect to the current input terminal, and the external terminals taken externally of the second casing having a terminal arrangement in which the signal input terminals are located on an opposite side of the current input terminal with respect to the current output terminal.

Where the first casing and the second casing are bridge connected by a bus bar with the above mentioned arrangement, distances of connections between elements may be shortened to a minimum. Since signal input terminals may be located outside the bus bar, openings for exposure of signal input terminals need not be formed in the bus bar structure, so that the overall structure is simplified to make effective use of a surface area of the bus bar, with the result that a decrease in commutating inductance is achieved.

A second embodiment of the invention provides a module type semiconductor device of high power capacity which comprises having a projecting central portion whose top is plane casing sealing therein at least one pair of semiconductor chips for forming a power semiconductor device and having two different planes; a current input terminal and a current output terminal taken externally of the casing at the projecting central portion thereof and from one of the planes higher than the other plane of the power semiconductor device; and two pairs of equivalent signal input terminals located on a lower plane positioned on both sides of the central higher plane and connected in common with the casing.

Similar effects as in the first embodiment may be obtained by fabricating a structure using the above module type semiconductor device in a pair. The device according to this embodiment is suitable for mass production since there is only a single layout for terminals that are taken out of the casing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification illustrate presently preferred embodiments of the invention, and together with the general description given above and the detailed description of the preferred embodiments given below, serve to explain the principles of the invention.

FIG. 4A is a plan view showing the appearance of a module package of one of a pair of module type semiconductor devices according to the first embodiment of the invention;

FIG. 4B is a view similar to FIG. 4A showing the appearance of a module casing of the other of the pair of module type semiconductor devices according to the first embodiment of the invention;

FIG. 4C is a side view of the structure shown in FIG. 4A;

FIG. 4D is a side view of the structure shown in FIG. 4B;

FIG. 5 is a perspective view showing the inside structure of the module type semiconductor devices according to this invention;

FIG. 7A is a plan illustrating the appearance of a module package of module type semiconductor devices according to the second embodiment of the invention;

FIG. 7B is a side view of the structure shown in FIG. 7A; and

FIG. 8 is a view showing the form of mounting of mutually connected module type semiconductor devices (IGBTs) as viewed from the side, in accordance with the second embodiment of the invention.

DETAILED DESCRIPTION OF THE PREFERRED EMBODIMENTS

Figure 1A:
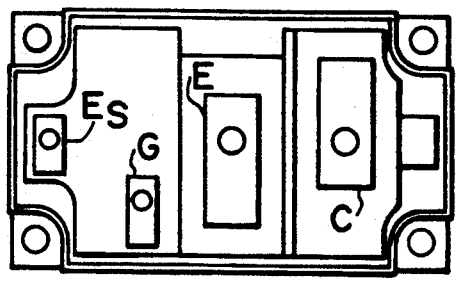
FIG. 1A is a plan view illustrating the outer appearance of a conventional module casing for a module type semiconductor device (IGBT)
Figure 1B:
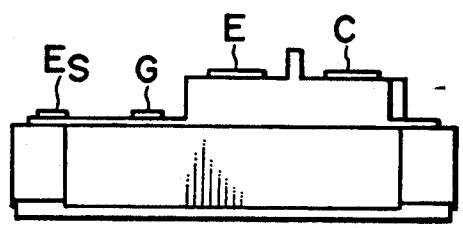
FIG. 1B is a side view of the structure shown in FIG. 1A.
Figure 1C:
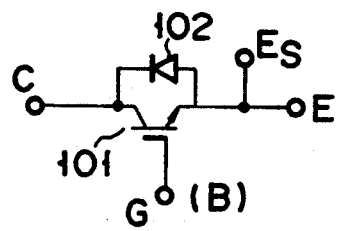
FIG. 1C is an equivalent circuit of the IGBT.

The embodiments of the invention will be described with reference to the accompanying drawings. FIGS. 4A, 4B, 4C and 4D show the appearance of module type semiconductor devices according to the first embodiment. It is a feature that a pair of module type semiconductor devices 401 and 402 form a set.

In particular, the arrangement of terminals of the module type semiconductor device 401 which comprise an IGBT is in the order of signal input terminals Es and G, and an emitter E and a collector C the contacts to which serve as main current external terminals. In contrast, in the module type semiconductor device 402, the order of the emitter E and the collector C is opposite, and they are in the order of signal input terminals Es and G, the collector C and the emitter E the contacts to which serve as the main current external terminals.

A pair of the module type semiconductor devices 401 and 402 are structured with equivalent electrical properties, and their inside structures are as shown in FIG. 5. In the figure, two insulating substrates 502a and 502b of an identical nature are soldered on a heat radiation substrate 501. On the insulating substrate 502a are fixed a metal plate 503a and relaying metal plates 504a and 505a on both sides of the metal plate 503a. Likewise, on the insulating substrate 502b are fixed a metal plate 503b and relaying metal places 504b and 505b on both sides of the metal plate 503b. Identical semiconductor chips 506 are mounted two by two on each of the metal plates 503a and 503b.

Wiring of electrodes on the semiconductor chips 506, here an emitter and a gate, is effected such that the emitter is connected to the metal plates 504a and 504b by metal wiring lines 507, and the gate is connected to the metal plates 505a and 505b by metal wiring lines 507. A power semiconductor device 508 is thus structured.

While not illustrated, a metal lead acting as an external terminal common to the two relaying metal plates 504a and 504b is soldered to form a main current external terminal of the emitter. Further, a metal lead acting as an external terminal common to the two relaying metal plates 503a and 503b is soldered to constitute a signal input external terminal of the gate. A metal lead acting as an external terminal common to the two relaying metal plates 504a and 504b is soldered to form a signal input external terminal of the emitter.

These external terminals are fabricated to have a terminal structure shown in the module type semiconductor device 401 or 402 of FIGS. 4A and 4B. For example, in forming main current external terminals of the emitter and the collector, two kinds of external terminal metal lead may be used so that the positioning of the main current terminals of the collectors and the emitters which are externally taken out of the semiconductor devices is mutually opposite.

Instead of connecting the relaying metal plates 504a and 505a, or 504b and 505b to the external terminals, the plates themselves may be externally taken out as external terminals.

As a result of this, a pair of module type semiconductor devices 401 and 402 having the terminal arrangement as shown in FIGS. 4A, 4B, 4C and 4D are constituted. A resin casing 403 is bonded on the heat radiation substrate 501 shown in FIG. 5. The resin casing 403 is resin sealed to protect the semiconductor chips and the other component elements shown in FIG. 5.

Figure 2:
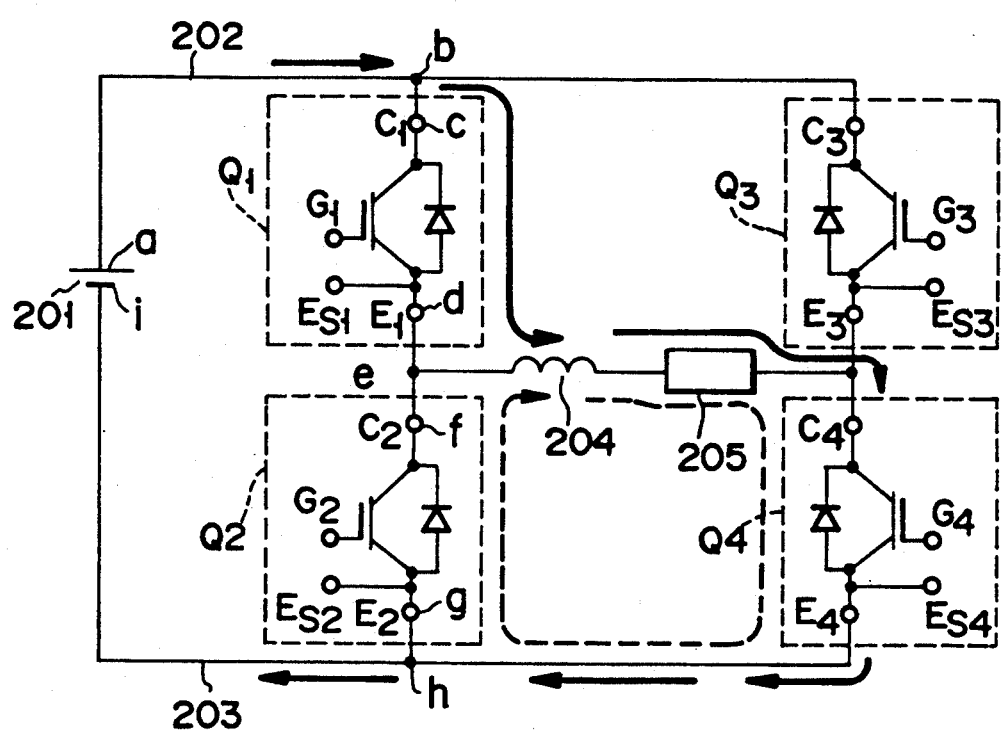
FIG. 2 is a circuit diagram showing the structure of an application circuit to which this invention relates.
Figure 6A:
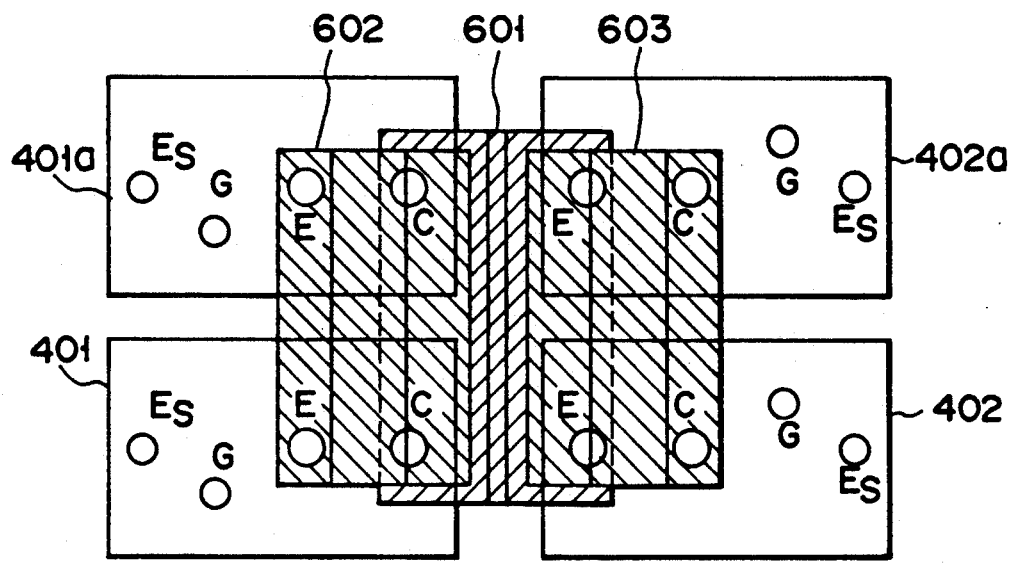
FIG. 6A is a plan view showing the form of mounting of mutually connected module type semiconductor devices (IGBTs) according to the first embodiment of the invention.
Figure 6B:
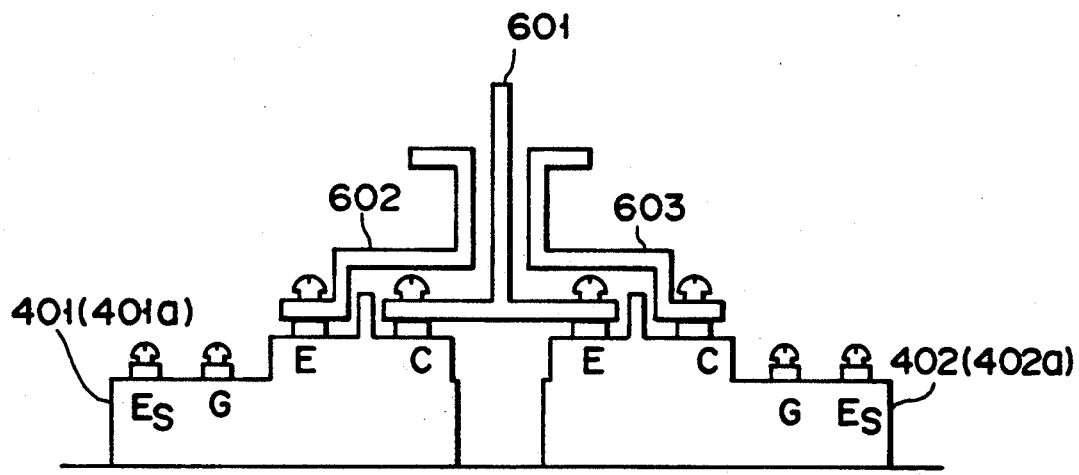
FIG. 6B is a view showing the appearance of the structure of FIG. 6A as viewed from the side.

A pair of the module type semiconductor devices 401 and 402 may form a half bridge circuit as shown in FIGS. 6A and 6B by employing another set of a pair of the devices designated by reference numerals 401a and 402a. Wiring interconnections of elements as those of Q1 and Q2 in the circuit arrangement of FIG. 2 are as follows.

The collector terminals C of the semiconductor device 401 and 401a and the emitter terminals E of the devices 402 and 402a are interconnected by a bus bar 601 and externally taken out as an output electrode. A positive electrode of the DC power supply (bus 202 side in FIG. 2) is connected to a bus bar 602, and a negative electrode (bus 203 side in FIG. 2) to a bus bar 603. The bus bars 602 and 603 are disposed in as parallel as possible to and in as close as possible proximity to the bus bar 601. The bus bar 602 is connected to the emitter terminals E of the semiconductor devices 401 and 401a, and the bus bar 603 is connected to the collector terminals C of the semiconductor devices 402 and 402a.

As has been described, the module type semiconductor devices in pairs shown in FIGS. 4A to 4D and 6A and 6B in accordance with the first embodiment are featured by the arrangement that, in one of a pair of the module type semiconductor devices, signal input terminals (corresponding to Es and G) are located on the other side of current output terminals (corresponding to the emitter terminals E) with respect to current input terminals (corresponding to the collector terminals C), and that, in the other of a pair of the module type semiconductor devices, signal input terminals are mounted on the other side of current input terminals with respect to current output terminals. The above construction produces the following functions and meritorious effects.

1. Pairs of module type semiconductor devices are easily fabricated using all of the components in common, except for the preparation of two kinds of external terminal metal leads for connection with the relaying metal plates. There are almost no differences in electrical properties between the pair of the semiconductor devices.

Figure 3A:
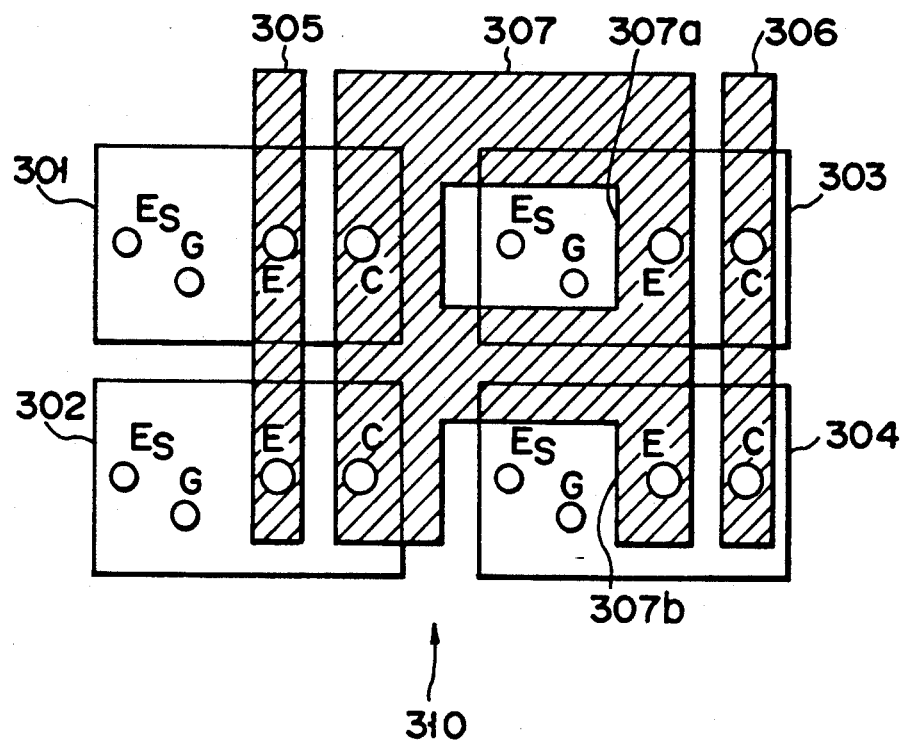
FIG. 3A is a plan view showing the form of mounting of mutually connected module type semiconductor devices (IGBTs) of a known type.
Figure 3B:
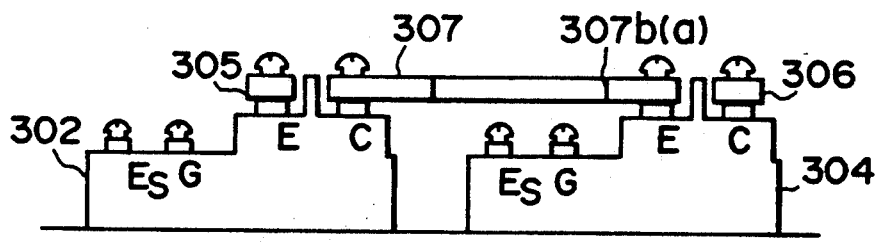
FIG. 3B is an outside view of the structure shown in FIG. 3A as viewed from the side.

2. Distances of connections between elements in the case of bridge connections may be shortened to the minimum. Since the signal input terminals may be located outside the bus bars 601, 602 and 603, openings such as those 307a and 307b formed in the bus bar 306 in FIG. 3A need not be formed. Space or the surface area of the bus bar thus may be effectively used.

3. The bus bars 602 and 603 leading to the electrodes on the side of the bus 202 and on the side of the bus 203 in the bridge circuit shown in FIG. 2 are capable of being projected upright in parallel to the bus bar 601 functioning as a connector electrode between elements, so that magnetic fluxes to be generated by the bus bars at turn-on times may be cancelled. The amount of commutating inductance may thus be kept minimum.

Item 3 above will be expanded with reference to FIG. 2. When current commutates as shown by an arrow in a dotted line upon turn-off of the IGBT Q1, which occurs subsequent to a stage in which the IGBTs Q1 and Q4 are turned on to allow current to flow as shown by arrows in solid lines, magnetic fluxes between the conductive busses between a and b and between h and i are canceled and inductance is minimum if the busses are wired in close proximity to each other. On the other hand, if the nodes between b-c and d-e of the IGBT Q1 are brought in close proximity to each other and wiring is effected to permit the direction of current flow is to be inverted, inductance therebetween is also minimum. Further, bringing the nodes between e-f and g-h in the IGBT Q2 in close proximity to each other to cancel magnetic fluxes, inductance therebetween is also brought to a minimum.

With the above arrangement, a bridge circuit, such as one shown in FIG. 2, may have bus bar wiring as shown in FIGS. 6A and 6B, even if Q1 and Q4 are arranged by parallel connecting a plurality of module type semiconductor devices, regardless of the number of parallel interconnections. The inductance of the commutating circuit is thus made minimum. As a result, surge voltage at the time of commutation, to be generated upon turn-on and off of the IGBTs may be greatly decreased.

The second embodiment illustrated in FIGS. 7A and 7B provides a novel package configuration for achieving the structure of a pair of the module type semiconductor device shown in FIGS. 4A to 4D with a single type of casing. A half bridge circuit in which the module type semiconductor devices according to the second embodiment are connected in parallel is shown in FIG. 8.

In FIGS. 7A and 7B, on both sides of the collector C and the emitter E which are the main current terminals is mounted a pair of signal input terminals Es and G, which are interconnected to each other within the module. The input of signals can thus be effected using only one of the pair of the signal input terminals. A plane on which the signal input terminals Es and G are located is set lower than a plane on which the main current terminals E and C are positioned.

Two of the module-type semiconductor device 701, denoted by reference numerals 701-1 and 701-2, may be Wired by bus bars 801, 802 and 803 as shown in FIG. 8. Terminals Es and G of the respective semiconductor devices 701-1 and 701-2 are used as signal input terminals and terminals Es' and G' located inwardly of the devices are not used, so that the inductance of the commutating circuit can be minimized similarly as in the first embodiment shown in FIGS. 6A and 6B.

While the length of the bus bar 801 in FIG. 8 is slightly longer than the bus bar 601 in FIG. 6B, the increase of inductance is negligibly small inasmuch as the bus bar 801 may be positioned in parallel to and in close proximity to the bus bars 802 and 803.

In FIGS. 7A and 7B, the non used signal input terminals Es' and G' are formed on a plane lower than that of the main current terminals E and C, so that the presence of the non used signal input terminals G' and Es' is not at all a bar to linearly connecting the collector C of the semiconductor device 701 and the emitter E of the semiconductor device 701a by the bus bar 801. In comparison with the first embodiment, this arrangement has an advantage in that the terminals that are taken out externally of the casing are in a single pattern or arrangement, so that the structure is suited for mass production.

In the foregoing embodiments, the signal input terminals Es and G have been described as an example of screw terminals, they may of course be in fastening terminals configuration, etc. Further, the IGBTs have been described as an example of the module type semiconductor device according to this invention, the invention is applicable also to usual MOS FETs, bipolar transistors, etc. Needless to say, the effects of the invention are most conspicuously displayed in IGBT elements having a high current capacity and a high speed switching function.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A subassembly for a semiconductor device of a high power capacity comprising:
    a fist casing having terminals extending from a top surface including
        a signal input terminal,
        a current output terminal,
        a current input terminal between the signal input terminal and the current output terminal, and
        a power semiconductor device having a control input coupled to the signal input terminal, and a current path coupled between the current input terminal and the current output terminal;
    a second casing, of substantially equivalent type of the first casing, having terminals extending from a top surface including
        a signal input terminal,
        a current input terminal, opposed to the current output terminal of the first casing,
        a current output terminal between the signal input terminal and the current input terminal, and
        a power semiconductor device having a control input coupled to the signal input terminal, and a current path coupled between the current input terminal and the current output terminal; and
    means for electrically interconnecting the current output terminal of said first casing with the current input terminal of said second casing,
    wherein said first and second casings are on a plane in a pair such that the current output terminal of said first casing and current input terminal of said second casing are in proximity, and opposed to each other.

2. The subassembly for a semiconductor device according to claim 1, wherein said first and second casings are composed respectively of a resin.

3. The subassembly for a semiconductor device according to claim 1, wherein said power semiconductor devices include pairs of semiconductor chips having substantially equivalent electrical properties.

4. The subassembly for a semiconductor device according to claim 3, wherein said semiconductor chips have a layout common to said first and second casings.

5. The subassembly for a semiconductor device according to claim 1, wherein said terminals are screw terminals.

6. The subassembly for a semiconductor device according to claim 1, wherein said signal input terminals are fastening configuration terminals.

7. The subassembly for a semiconductor device according to claim 1, further comprising:

a first bus bar electrically interconnecting said opposing current input terminal and current output terminal and which extends upward as an electrode;

a second bus bar located parallel to and in proximity to one side of said first bus bar and electrically connected to the current output terminal of first casing; and a third bus bar located parallel to and in proximity to the other side of said first bus bar and electrically connected to the current input terminal of said second casing.

8. A subassembly for a semiconductor device of a high power capacity comprising:

a first casing having a central top portion at a first level, a first portion on a side of the top portion at a level lower than the first level, and a second portion on an opposite side of the top portion at a level lower than the first level;

a pair of semiconductor chips sealed within the casing;

a first current input terminal and a first current output terminal extending out of the top portion of the first casing;

a first plurality of signal input terminals extending out of the first portion;

a second plurality of signal input terminals extending out of the second portion, each signal input terminal of the second plurality connected within the casing to a corresponding signal input terminal of the first plurality;

a second casing having a central top portion at a first level, a first portion on a side of the top portion at a level lower than the first level, and a second portion on an opposite side of the top portion at a level lower than the first level;

a pair of semiconductor chips sealed within the casing;

a second current input terminal and a second current output terminal extending out of the top portion of the second casing;

a first plurality of signal input terminals extending out of the first portion;

a second plurality of signal input terminals extending out of the second portion, each signal input terminal of the second plurality connected within the casing to a corresponding signal input terminal of the first plurality; and means for electrically interconnecting the current output terminal of said first casing with the current input terminal of said second casing, wherein said first and second casings are on a plane in a pair such that the current output terminal of said first casing and current input terminal of said second casing are in a vicinity and opposed to each other, and the first portion of the first casing is opposed to the second portion of the second casing.

9. The subassembly for a semiconductor device according to claim 8, wherein said casing is composed of a resin.

10. The subassembly for a semiconductor device according to claim 8, wherein said semiconductor chips have substantially equivalent electrical properties.

11. The subassembly for a semiconductor device according to claim 8, wherein the current input terminal, the current output terminal and the first and second pluralities of signal input terminals are, respectively, screw terminals.

12. The subassembly for a semiconductor device according to claim 8, wherein the current input terminal, the current output terminal and the first and second pluralities of signal input terminals are, respectively, fastening configuration terminals.

13. The semiconductor device according to claim 7, wherein the bus bars are sufficiently close so as to mutually cancel magnetic fluxes generated therein.

14. A subassembly for a semiconductor device of a high power capacity, comprising:

a first bus bar;
a second bus bar;
a third bus bar;

a first casing defining a central top portion at a first level, a first portion on a side of the top portion at a level lower than the first level, a second portion on an opposite side of the top portion at a level lower than the first level, and an interior portion, including a semiconductor chip in the interior portion, a current input terminal extending out of the top portion and electrically connected to the first bus bar, a current output terminal extending out of the top portion, a first plurality of signal input terminals extending out of the first portion, and a second plurality of signal input terminals extending out of the second portion, each signal input terminal of the second plurality connected to a corresponding signal input terminal of the first plurality; and a second casing, on a plane with the first casing, defining a central top portion at a first level, a first portion on a side of the top portion at a level lower than the first level, a second portion on an opposite side of the top portion at a level lower than the first level, and an interior portion, including a semiconductor chip in the interior portion, a current input terminal extending out of the top portion, opposed to the current output terminal of the first casing, and electrically coupled to the current output terminal of the first casing by the second bus bar, the second bus bar extending upward as an electrode, the first bus bar parallel to a side of the second bus bar, and a current output terminal extending out of the top portion and electrically connected to the third bus bar, the third bus bar parallel to an opposite side of the second bus bar, a first plurality of signal input terminals extending out of the first portion, and a second plurality of signal input terminals extending out of the second portion, each signal input terminal of the second plurality connected to a corresponding signal input terminal of the first plurality, wherein the first portion of the first casing is opposed to the second portion of the second casing.

15. The semiconductor device according to claim 14, wherein the bus bars are sufficiently close so as to mutually cancel magnetic fluxes generated therein.

16. The semiconductor device according to claim 7, wherein the first bus bar is at a spacing relative to the first and second casings.

17. The semiconductor device according to claim 14, wherein the second bus bar is at a spacing relative to the first and second casings.

18. A subassembly for a semiconductor device of a high power capacity comprising:
- a first casing including
  - a signal input terminal extending from a first portion at a first level,
  - a current output terminal extending from a second portion at a level higher than the first level,
  - a current input terminal, between the signal input terminal and the current output terminal, extending from the second portion, and
  - a power semiconductor device having a control input coupled to the signal input terminal, and a current path coupled between the current input terminal and the current output terminal;
- a second casing, of substantially equivalent type of the first casing, having terminals extending from a top surface including
  - a signal input terminal extending from a first portion at a first level,
  - a current input terminal, opposed to the current output terminal of the first casing, and extending from a second level higher than the first level,
  - a current output terminal, between the signal input terminal and the current input terminal, extending from the second level, and
  - a power semiconductor device having a control input coupled to the signal input terminal, and a current path coupled between the current input terminal and the current output terminal;
- a bus bar connected between the current output terminal of the first casing and the current input terminal of the second casing;
- means for electrically interconnecting the current output terminal of said first casing with the current input terminal of said second casing, wherein said first and second casings are on a plane in a pair such that the current output terminal of said first casing and current input terminal of said second casing are in a vicinity and opposed to each other, and the first portion of the first casing is opposed to the second portion of the second casing.

19. A subassembly used for a semiconductor device for providing a bridge connection, comprising:
- a first casing having terminals extending from a top surface including
  - a signal input terminal;
  - a current output terminal;
  - a current input terminal between the signal input terminal and the current output terminal, and
  - a power semiconductor device having a control input coupled to the signal input terminal, and a current path coupled between the current input terminal and the current output terminal;
- a second casing having terminals extending from a top surface including
  - a signal input terminal,
  - a current output terminal, facing the current input terminal of the first casing in a first direction,
  - a current input terminal between the signal input terminal and the current output terminal, and
  - a power semiconductor device having a control input coupled to the signal input terminal, and a current path coupled between the current input terminal and the current output terminal;
- a third casing having terminals extending from a top surface including
  - a signal input terminal,
  - a current input terminal, facing the current input terminal of the first casing in a second direction perpendicular to the first direction,
  - a current output terminal between the signal input terminal and the current input terminal, and
  - a power semiconductor device having a control input coupled to the signal input terminal, and a current path coupled between the current input terminal and the current output terminal;
- a fourth casing having terminals extending from a top surface including
  - a signal input terminal,
  - a current output terminal, facing the current input terminal of the third casing in the first direction, facing the current output terminal of the second casing in the second direction,
  - a current output terminal, between the signal input terminal and the current input terminal, and opposed to the current output terminal of the second casing, and
  - a power semiconductor device having a control input coupled to the signal input terminal, and a current path coupled between the current input terminal and the current output terminal;
- a first bus bar connected to the current output terminals of the first and third casings;
- a second bus bar connected to the current input terminals of the first and third casings, and to the current output terminals of the second and fourth casings; and
- a third bus bar connected to the current input terminals of the second and fourth casings.

20. The subassembly for a semiconductor device according to claim 19, wherein the first, second, and third bus bars are each laterally removed from the signal input terminals of the first, second, third, and fourth casings.

21. A subassembly used for a semiconductor device for providing a bridge connection, comprising:
- a first, second, third and fourth casings, each casing defining a central top portion at a first level, a first portion on a side of the top portion at a level lower than the first level, a second portion on a opposite side of the top portion at a level lower than the first level, and an interior portion, each casing including
  - a current input terminal extending out of the top portion,
  - a current output terminal extending out of the top portion,
  - a first signal input terminal extending out of the first portion,
  - a second signal input terminal extending out of the second portion, and connected to the first signal input terminal, and
  - a semiconductor chip including a power semiconductor device having a control input coupled to the first and second signal input terminals, and a current path coupled between the current input terminal and the current output terminal, wherein
- the current output terminal of the second casing faces the current input terminal of the first casing in a first direction,
- the current input terminal of the third casing faces the current input terminal of the first casing is a second direction perpendicular to the first direction, the current output terminal of the third casing faces the current output terminal of the first casing is the second direction, the current input terminal of the fourth casing faces the current output terminal of the third casing in the first direction, and the current input of the fourth casing faces the current input terminal of the second casing in the second direction, and wherein the device further includes a first bus bar connected to the current output terminals of the first and third casings;

a second bus bar connected to the current input terminals of the first and third casings, and to the current output terminals of the second and fourth casings;

a third bus bar connected to the current input terminals of the second and fourth casings.

22. The subassembly for a semiconductor device according to claim 21, wherein the output terminals of the casings have a first width, and wherein the first bus bar has a width several times greater than the first width.

23. The subassembly for a semiconductor device according to claim 22, wherein the first bus bar has a portion parallel to a side of the second bus bar, and the third bus bar has a portion parallel to an opposite side of the second bus bar.

24. A semiconductor device of a high power capacity comprising:

a first casing having terminals extending from a top surface including
  a signal input terminal,
  a current output terminal, and
  a current input terminal between the signal input terminal and the current output terminal;

a second casing, of substantially equivalent type of the first casing, having terminals extending from a top surface including
  a signal input terminal,
  a current input terminal, opposed to the current output terminal of the first casing, and
  a current output terminal between the signal input terminal and the current input terminal;

power semiconductor devices of substantially equivalent electrical properties sealed respectively within said first and second casings; and means for electrically connecting terminals of the first casing to terminals of the second casing so as to decrease commutating inductance.

25. A subassembly for a semiconductor device of a high power capacity comprising:

a first casing having a central first top portion at a first level;

a first pair of semiconductor chips sealed within the first casing;

a current input terminal and a current output terminal extending out of the first top portion;

a lower portion on a side of the first top portion at a level lower than the first level;

a first plurality of signal input terminals extending out of the lower portion;

another lower portion on an opposite side of the first top portion at the level lower than the first level;

a second plurality of signal input terminals extending out of the other lower portion, each signal input terminal of the second plurality connected within the first casing to a corresponding signal input terminal of the first plurality;

a second casing having a central second top portion at the first level;

a second pair of semiconductor chips sealed within the second casing;

a current input terminal and a current output terminal extending out of the second top portion;

a lower portion on a side of the second top portion at the level lower than the first level;

a third plurality of signal input terminals extending out of the lower portion on the side of the second top portion;

another lower portion on an opposite side of the second top portion at the level lower than the first level;

a fourth plurality of signal input terminals extending out of the other lower portion on the opposite side of the second top portion, each signal input terminal of the fourth plurality connected within the second casing to a corresponding signal input terminal of the third plurality; and means for connecting terminals on the first top portion to terminals on the second top portion so as to decrease commutating inductance.

26. The semiconductor device according to claim 19, wherein said bus bars have a wide surface area to decrease commutating inductance of a bridge connection, and are integrated with one another.

27. The semiconductor device according to claim 21, wherein said bus bars have a wide surface area to decrease commutating inductance of a bridge connection, and are integrated with one another.

* * * * *